US008227268B2

(12) United States Patent
Emerson et al.

(10) Patent No.: US 8,227,268 B2
(45) Date of Patent: Jul. 24, 2012

(54) METHODS OF FABRICATING GROUP III NITRIDE BASED LIGHT EMITTING DIODE STRUCTURES WITH A QUANTUM WELL AND SUPERLATTICE, GROUP III NITRIDE BASED QUANTUM WELL STRUCTURES AND GROUP III NITRIDE BASED SUPERLATTICE STRUCTURES

(75) Inventors: David Todd Emerson, Durham, NC (US); James Ibbetson, Santa Barbara, CA (US); Michael John Bergmann, Durham, NC (US); Kathleen Marie Doverspike, Apex, NC (US); Michael John O'Loughlin, Chapel Hill, NC (US); Howard Dean Nordby, Jr., Pittsboro, NC (US); Amber Christine Abare, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/875,353

(22) Filed: Oct. 19, 2007

(65) Prior Publication Data
US 2008/0038858 A1   Feb. 14, 2008

Related U.S. Application Data

(62) Division of application No. 10/963,666, filed on Oct. 13, 2004, now Pat. No. 7,312,474, which is a division of application No. 10/140,796, filed on May 7, 2002, now Pat. No. 6,958,497.

(60) Provisional application No. 60/294,445, filed on May 30, 2001, provisional application No. 60/294,308, filed on May 30, 2001, provisional application No. 60/294,378, filed on May 30, 2001.

(51) Int. Cl.
*H01L 21/00* (2006.01)

(52) U.S. Cl. .............. 438/22; 438/20; 438/48; 257/14; 257/15

(58) Field of Classification Search ........... 257/14–15; 438/20, 22, 48
See application file for complete search history.

(56) References Cited

U.S. PATENT DOCUMENTS
5,294,833 A  3/1994 Schetzina ............ 257/741
(Continued)

FOREIGN PATENT DOCUMENTS
EP  0 881 666 A2  12/1998
(Continued)

OTHER PUBLICATIONS

American Heritage Dictionary, Second College Edition, Houghton Mifflin Company, 1982, p. 867.
(Continued)

*Primary Examiner* — Samuel Gebremariam
(74) *Attorney, Agent, or Firm* — Myers Bigel Sibley & Sajovec, P.A.

(57) ABSTRACT

A light emitting diode is provided having a Group III nitride based superlattice and a Group III nitride based active region on the superlattice. The active region has at least one quantum well stricture. The quantum well structure includes a first Group III nitride based barrier layer, a Group III nitride based quantum well layer on the first barrier layer and a second Group III nitride based barrier layer. A Group III nitride based semiconductor device and methods of fabricating a Group III nitride based semiconductor device having an active region comprising at least one quantum well structure are provided. The quantum well structure includes a well support layer comprising a Group III nitride, a quantum well layer comprising a Group III nitride on the well support layer and a cap layer comprising a Group III nitride on the quantum well layer. A Group III nitride based semiconductor device is also provided that includes a gallium nitride based superlattice having at least two periods of alternating layers of $In_XGa_{1-X}N$ and $In_YGa_{1-Y}N$, where $0 \leq X < 1$ and $0 \leq Y < 1$ and X is not equal to Y. The semiconductor device may be a light emitting diode with a Group III nitride based active region. The active region may be a multiple quantum well active region.

31 Claims, 3 Drawing Sheets

U.S. PATENT DOCUMENTS

| | | | |
|---|---|---|---|
| 5,351,255 A | 9/1994 | Schetzina | 372/45 |
| 5,366,927 A | 11/1994 | Schetzina | 438/603 |
| 5,393,993 A | 2/1995 | Edmond et al. | 257/77 |
| 5,409,859 A | 4/1995 | Glass et al. | 438/523 |
| 5,523,589 A | 6/1996 | Edmond et al. | 257/77 |
| 5,585,648 A | 12/1996 | Tischler | 257/77 |
| 5,661,074 A | 8/1997 | Tischler | 438/32 |
| 5,670,798 A | 9/1997 | Schetzina | 257/96 |
| 5,679,152 A | 10/1997 | Tischler et al. | 117/97 |
| 5,679,965 A | 10/1997 | Schetzina | 257/103 |
| 5,684,309 A * | 11/1997 | McIntosh et al. | 257/191 |
| 5,744,829 A | 4/1998 | Murasato et al. | |
| 5,771,256 A | 6/1998 | Bhat | |
| 5,777,350 A | 7/1998 | Nakamura et al. | 257/96 |
| 5,818,072 A | 10/1998 | Schetzina | 257/78 |
| 5,874,747 A | 2/1999 | Redwing et al. | 257/77 |
| 6,046,464 A | 4/2000 | Schetzina | 257/96 |
| 6,060,335 A | 5/2000 | Rennie et al. | |
| 6,133,589 A | 10/2000 | Krames et al. | 257/103 |
| 6,150,672 A | 11/2000 | Kaneko | 257/94 |
| 6,153,010 A | 11/2000 | Kiyoku et al. | 117/95 |
| 6,153,894 A | 11/2000 | Udagawa | |
| 6,156,581 A | 12/2000 | Vaudo et al. | 438/46 |
| 6,162,656 A * | 12/2000 | Kunisato et al. | 438/46 |
| 6,172,382 B1 | 1/2001 | Nagahama et al. | |
| 6,201,262 B1 | 3/2001 | Edmond et al. | 257/77 |
| 6,238,945 B1 | 5/2001 | Kaneko | 438/46 |
| 6,337,493 B1 | 1/2002 | Tanizawa et al. | 257/79 |
| 6,410,939 B1 | 6/2002 | Koide et al. | |
| 6,447,604 B1 | 9/2002 | Flynn et al. | |
| 6,452,214 B2 | 9/2002 | Kaneyama et al. | |
| 6,459,100 B1 | 10/2002 | Doverspike et al. | 257/97 |
| 6,576,933 B2 | 6/2003 | Nitta et al. | |
| 6,586,762 B2 | 7/2003 | Kozaki | |
| 6,608,330 B1 | 8/2003 | Yamada | |
| 6,664,560 B2 | 12/2003 | Emerson et al. | 257/14 |
| 6,717,185 B2 | 4/2004 | Edmond et al. | 257/97 |
| 6,734,033 B2 | 5/2004 | Emerson et al. | 438/29 |
| 6,734,035 B2 | 5/2004 | Watanabe et al. | |
| 6,791,119 B2 | 9/2004 | Slater et al. | |
| 6,794,684 B2 | 9/2004 | Slater et al. | |
| 6,821,800 B2 * | 11/2004 | Koide et al. | 438/22 |
| 6,833,564 B2 | 12/2004 | Shen et al. | |
| 6,891,268 B2 | 5/2005 | Tomiya et al. | |
| 6,943,381 B2 | 9/2005 | Gardner et al. | |
| 6,958,497 B2 | 10/2005 | Emerson et al. | |
| 7,279,717 B2 * | 10/2007 | Yamada | 257/97 |
| 7,557,380 B2 | 7/2009 | Haberern et al. | |
| 2002/0053676 A1 | 5/2002 | Kozaki | 257/88 |
| 2002/0056836 A1 | 5/2002 | Sawazaki et al. | |
| 2002/0195606 A1 | 12/2002 | Edmond et al. | |
| 2003/0006418 A1 | 1/2003 | Emerson et al. | |
| 2003/0085409 A1 | 5/2003 | Shen et al. | |
| 2003/0153112 A1* | 8/2003 | Watanabe et al. | 438/47 |
| 2005/0056824 A1 | 3/2005 | Bergmann et al. | |
| 2006/0002442 A1 | 1/2006 | Haberern et al. | |
| 2006/0046328 A1 | 3/2006 | Raffetto et al. | |
| 2006/0186418 A1 | 8/2006 | Edmond et al. | |
| 2007/0018198 A1 | 1/2007 | Brandes et al. | |
| 2008/0258130 A1 | 10/2008 | Bergmann et al. | |
| 2009/0283746 A1 | 11/2009 | Chua et al. | |

FOREIGN PATENT DOCUMENTS

| | | |
|---|---|---|
| EP | 1 063 711 A1 | 12/2000 |
| EP | 1063711 | 12/2000 |
| EP | 1 189 289 A1 | 3/2002 |
| EP | 1189289 | 3/2002 |
| EP | 1 221 723 A1 | 7/2002 |
| EP | 1 313 187 A1 | 5/2003 |
| JP | 6268257 | 9/1994 |
| JP | 07-162038 | 6/1995 |
| JP | 07-176826 | 7/1995 |
| JP | 08-023124 | 1/1996 |
| JP | 08-070139 | 3/1996 |
| JP | 08-162671 | 6/1996 |
| JP | 08-274414 | 10/1996 |
| JP | 8-316585 | 11/1996 |
| JP | 08-330630 | 12/1996 |
| JP | 09-148678 | 6/1997 |
| JP | 09-153642 | 6/1997 |
| JP | 9162444 | 6/1997 |
| JP | 9219556 | 8/1997 |
| JP | 9266326 A | 10/1997 |
| JP | 9-331116 A | 12/1997 |
| JP | 10012969 | 1/1998 |
| JP | 10-041581 | 2/1998 |
| JP | 10-065271 A2 | 3/1998 |
| JP | 10-084132 | 3/1998 |
| JP | 10145000 | 5/1998 |
| JP | 10145002 | 5/1998 |
| JP | 10-335757 A | 12/1998 |
| JP | 11-40850 A | 2/1999 |
| JP | 11040850 | 2/1999 |
| JP | 11040850 A | 2/1999 |
| JP | 11-068159 | 3/1999 |
| JP | 11074562 | 3/1999 |
| JP | 11-177175 | 7/1999 |
| JP | 11186659 | 7/1999 |
| JP | 11191638 | 7/1999 |
| JP | 11224972 | 8/1999 |
| JP | 11238945 | 8/1999 |
| JP | 11251684 | 9/1999 |
| JP | 11298090 | 10/1999 |
| JP | 11-308964 | 11/1999 |
| JP | 11-330552 | 11/1999 |
| JP | 2000-068594 | 3/2000 |
| JP | 2000-150957 A | 5/2000 |
| JP | 200150956 | 5/2000 |
| JP | 2000133883 | 5/2000 |
| JP | 2000-216432 | 8/2000 |
| JP | 2000-232259 A | 8/2000 |
| JP | 200244072 | 9/2000 |
| JP | 2000-349337 A | 12/2000 |
| JP | 2001-168471 | 6/2001 |
| JP | 2001-237457 | 8/2001 |
| JP | 2000307149 | 1/2002 |
| JP | 2002-374043 A | 12/2002 |
| JP | 2003-152219 A | 5/2003 |
| JP | 2004-186708 A | 7/2004 |
| KR | 2001-0075185 | 8/2001 |
| KR | 2003-0097817 | 12/2003 |
| WO | WO 98/31055 | 7/1998 |
| WO | WO 99/05728 | 2/1999 |
| WO | WO 99/46822 | 9/1999 |
| WO | WO 00/21143 | 4/2000 |
| WO | WO 00/21144 | 4/2000 |
| WO | WO 00/76004 A1 | 12/2000 |
| WO | WO 02/05399 A1 | 1/2002 |
| WO | WO 02/097904 A2 | 12/2002 |

OTHER PUBLICATIONS

European Search Report corresponding to EP 03 07 8515; mailed on Feb. 2, 2004.
International Search Report for PCT/US 02/16407; Date of Mailing Nov. 13, 2002.
Korean Intellectual Property Office Non-Final Rejection; Aug. 28, 2008.
Korean Non-Final Rejection and English Translation (8 pages) corresponding to Korean Patent Application No. 10-2008-7026427; Mailing Date: Feb. 6, 2009.
Partial European Search Report (6 pages) corresponding to European Patent Application No. 09157557.1; Dated: May 28, 2009.
Communication and European Search Report corresponding to European Application No. 10169579.9 dated Dec. 7, 2010; 6 pages.
Communication and European Search Report corresponding to European Application No. 10180319.5 dated Dec. 7, 2010; 6 pages.
Notice of Preliminary Rejection (Non-Final) from Korean Intellectual Property Office corresponding to Korean Patent Application No. 10-2007-7001904; Dated Jul. 17, 2011; 6 pages, English translation thereof, 6 pages.
Japanese Office Action and English Translation (5 pages), corresponding Japanese Application No. 2007-523569; May 24, 2011.
American Heritage Dictionary, Second College Edition, 1982, Houghton Mifflin Company, Boston, MA., p. 867, definition of the English language word "On."

Flynn, J.S., et al., Properties of Delta Doped $Al_{0.25}Ga_{0.75}N$ and GaN Epitaxial Layers, Abstract, Paper #L11.44, Materials Research Society 2002 Fall Symposium, Warrendale, PA, USA.

Kim, K.H., et al., "111-nitride Ultraviolet Light-emitting Diodes with Delta Doping," *Appl. Phys. Lett.*, Jul. 21, 2003, pp. 566-568, vol. 83, No. 3.

Pan, Y.B., et al., "Reduction of Threading Edge Dislocation Density in n-type GaN by Si Delta-Doping," *Journal of Crystal Growth*, Jan. 15, 2006, pp. 255-258, vol. 286, No. 2.

Sciana, B., et al., "Epitaxial Growth and Characterisation of Silicon Delta-Doped GaAs, AlAs and $Al_xGa1-_xAs$," *Cryst. Res. Technol.*, Aug. 10, 2001, pp. 1145-1154, vol. 36.

Wang, L.S., et al., "Effects of Periodic Delta-doping on the Properties of GaN:Si Films Grown on Si (111) Substrates," *Appl. Phys. Lett.*, Dec. 13, 2004, vol. 85, No. 24.

Keyan, K., et al., "The Effect of Periodic Silane Burst on the Properties of GaN on Si (111) Substrates," *Singapore-MIT Alliance (SMA)*, Advanced Materials for Micro- and Nano-Systems (AMMNS), File No. AMMNS004.pdf, available in DSpace@MIT on Dec. 9, 2004, issued Jan. 2005.

International Search Report, mailed Feb. 15, 2006, for corresponding application No. PCT/US2005/022597.

Korean Non-Final Rejection and English Translation (12 pages), faxed Sep. 21, 2008, for corresponding Korean Application No. 10-2003-7012710.

JP Office Action Corresponding to Japanese Patent Application No. 2009-184911; Mailing Date: Oct. 3, 2011; English Translation, 4 pages.

JP Office Action Corresponding to Japanese Patent Application No. 2009-184910; Mailing Date: Oct. 3, 2011; English Translation, 6 pages.

Taiwan Office Action Corresponding to Taiwanese Patent Application No. 094122647; Mailing Date: Feb. 7, 2012; English Translation, 12 pages.

Japanese Office Action Corresponding to Japanese Patent Application No. 2007-523569; Mailing Date: Apr. 17, 2012; English Translation, 3 pages.

\* cited by examiner

METHODS OF FABRICATING GROUP III NITRIDE BASED LIGHT EMITTING DIODE STRUCTURES WITH A QUANTUM WELL AND SUPERLATTICE, GROUP III NITRIDE BASED QUANTUM WELL STRUCTURES AND GROUP III NITRIDE BASED SUPERLATTICE STRUCTURES

Related Applications

This application is a divisional of and claims priority from United States Divisional Application Ser. No. 10/963,666 filed Oct. 13, 2004, now U.S. Pat. No. 7,312,474 which claims priority from U.S. application Ser. No. 10/140,796, filed May 7, 2002, now U.S Pat. No. 6,958,497, which claims the benefit of, and priority from, Provisional Application Ser. No. 60/294,445, filed May 30, 2001 entitled MULTI-QUANTUM WELL LIGHT EMITTING DIODE STRUCTURE, Provisional Application Ser. No. 60/294,308, filed May 30, 2001 entitled LIGHT EMITTING DIODE STRUCTURE WITH SUPERLATTICE STRUCTURE and Provisional Application Ser. No. 60/294,378, filed May 30, 2001 entitled LIGHT EMITTING DIODE STRUCTURE WITH MULTI-QUANTUM WELL AND SUPERLATTICE STRUCTURE, the disclosures of which are hereby incorporated herein by reference in their entirety as if set forth fully herein.

FIELD OF THE INVENTION

This invention relates to microelectronic devices and fabrication methods therefor, and more particularly to structures which may be utilized in Group III nitride semiconductor devices, such as light emitting diodes (LEDs).

BACKGROUND OF THE INVENTION

Light emitting diodes are widely used in consumer and commercial applications. As is well known to those having skill in the art, a light emitting diode generally includes a diode region on a microelectronic substrate. The microelectronic substrate may comprise, for example, gallium arsenide, gallium phosphide, alloys thereof, silicon carbide and/or sapphire. Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent lamp.

One difficulty in fabricating Group III nitride based LEDs, such as gallium nitride based LEDs, has been with the fabrication of high quality gallium nitride. Typically, gallium nitride LEDs have been fabricated on sapphire or silicon carbide substrates. Such substrates may result in mismatches between the crystal lattice of the substrate and the gallium nitride. Various techniques have been employed to overcome potential problems with the growth of gallium nitride on sapphire and/or silicon carbide. For example, aluminum nitride (AlN) may be utilized as a buffer between a silicon carbide substrate and a Group III active layer, particularly a gallium nitride active layer. Typically, however, aluminum nitride is insulating rather than conductive. Thus, structures with aluminum nitride buffer layers typically require shorting contacts that bypass the aluminum nitride buffer to electrically link the conductive silicon carbide substrate to the Group III nitride active layer.

Alternatively, conductive buffer layer materials such as gallium nitride (GaN), aluminum gallium nitride (AlGaN), or combinations of gallium nitride and aluminum gallium nitride may allow for elimination of the shorting contacts typically utilized with AlN buffer layers. Typically, eliminating the shorting contact reduces the epitaxial layer thickness, decreases the number of fabrication steps required to produce devices, reduces the overall chip size, and/or increases the device efficiency. Accordingly, Group III nitride devices may be produced at lower cost with a higher performance. Nevertheless, although these conductive buffer materials offer these advantages, their crystal lattice match with silicon carbide is less satisfactory than is that of aluminum nitride.

The above described difficulties in providing high quality gallium nitride may result in reduced efficiency the device. Attempts to improve the output of Group III nitride based devices have included differing configurations of the active regions of the devices. Such attempts have, for example, included the use of single and/or double heterostructure active regions. Similarly, quantum well devices with one or more Group III nitride quantum wells have also been described. While such attempts have improved the efficiency of Group III based devices, further improvements may still be achieved.

SUMMARY OF THE INVENTION

Embodiments of the present invention provide a light emitting diode having a Group III nitride based superlattice and a Group III nitride based active region on the superlattice. The active region has at least one quantum well structure. The quantum well structure includes a first Group III nitride based barrier layer, a Group III nitride based quantum well layer on the first barrier layer and a second Group m nitride based barrier layer on the quantum well layer.

In further embodiments of the present invention, the light emitting diode includes from about 2 to about 10 repetitions of the at least one quantum well structure.

In additional embodiments of the present invention, the superlattice includes a gallium nitride based superlattice having at least two periods of alternating layers of $In_XGa_{1-X}N$ and $In_YGa_{1-Y}N$, where $0 \leq X < 1$ and $0 \leq Y < 1$ and X is not equal to Y. The first Group III nitride based barrier layer provides a well support layer comprising a Group III nitride and the second Group III nitride based barrier layer provides a cap layer comprising a Group III nitride on the quantum well layer.

In such embodiments, the cap layer may have a lower crystal quality than the well support layer.

In still further embodiments of the present invention, the well support layer comprises a gallium nitride based layer, the quantum well layer comprises an indium gallium nitride layer and the barrier layer comprises a gallium nitride based layer. In such embodiments, the well support layer and the cap layer may be provided by layers of $In_XGa_{1-X}N$ where $0 \leq X < 1$. Furthermore, the indium composition of the well support layer and the cap layer may be less than the indium composition of the quantum well layer.

The well support layer and the cap layer may also be provided by a layer of $Al_XIn_YGa_{1-X-Y}N$ where $0 < X < 1$, $0 \leq Y < 1$ and $X+Y \leq 1$. Furthermore, the well support layer and the cap layer may be undoped. Alternatively, the well support layer and the cap layer may have an n-type doping level of less than about $5 \times 10^{19}$ cm$^{-3}$. The cap layer and the well support layer may also have a higher bandgap than the quantum well layer. The combined thickness of the well support layer and the cap layer may be from about 50 to about 400 Å. The thickness of the well support layer may be greater than a thickness of the cap layer. The quantum well layer may have a thickness of from about 10 to about 50 Å. For example, the quantum well layer may have a thickness of about 20 Å. Furthermore, the percentage of indium in the quantum well layer may be from about 15% to about 40%.

In additional embodiments of the present invention, a Group III nitride based spacer layer is provided between the well support layer and the superlattice. The spacer layer may be undoped GaN.

In other embodiments of the present invention, the bandgap of the quantum well is less than the bandgap of the superlattice.

In further embodiments of the present invention, the light emitting diode includes a second well support layer comprising a Group III nitride on the cap layer, a second quantum well layer comprising a Group III nitride on the second well support layer and a second cap layer comprising a Group III nitride on the second quantum well layer.

In additional embodiments of the present invention, the gallium nitride based superlattice comprises from about 5 to about 50 periods. The alternating layers of $In_XGa_{1-X}N$ and $In_YGa_{1-Y}N$ may have a combined thickness of from about 10 to about 140 Å.

In particular embodiments of the present invention, $X=0$ for layers of $In_XGa_{1-X}N$ of the superlattice. In such embodiments, the InGaN layers may have a thickness of from about 5 to about 40 Å and the GaN layers may have a thickness of from about 5 to about 100 Å.

In further embodiments of the present invention, the gallium nitride based superlattice is doped with an n-type impurity to a level of from about $1\times10^{17}$ cm$^{-3}$ to about $5\times10^{19}$ cm$^{-3}$. The doping level of the gallium nitride based superlattice may be an actual doping level of layers of the alternating layers. The doping level may also be an average doping level of layers of the alternating layers. Thus, for example, the light emitting diode may include doped Group III nitride layers adjacent the superlattice where the doped Group III nitride layers are doped with an n-type impurity to provide an average doping of the doped Group III nitride layers and the superlattice of from about $1\times10^{17}$ cm$^{-3}$ to about $5\times10^{19}$ cm$^{-3}$. The bandgap of the superlattice may be from about 2.95 eV to about 3.35 eV and, in certain embodiments, may be about 3.15 eV.

In other embodiments of the present invention, a Group III nitride based semiconductor device having an active region comprising at least one quantum well structure is provided. The quantum well structure includes a well support layer comprising a Group III nitride, a quantum well layer comprising a Group III nitride on the well support layer and a cap layer comprising a Group III nitride on the quantum well layer.

The cap layer may have a lower crystal quality than the well support layer. The well support layer may be provided by a gallium nitride based layer, the quantum well layer may be provided by an indium gallium nitride layer and the barrier layer may be provided by a gallium nitride based layer. In such embodiments, the well support layer and the cap layer may be provided by layers of $In_XGa_{1-X}N$ where $0 \leq X<1$. Furthermore, the indium composition of the well support layer and the cap layer may be less the indium composition of the quantum well layer. Similarly, the well support layer and the cap layer may be provided by layers of $Al_XIn_YGa_{1-X-Y}N$ where $0<X<1$, $0 \leq Y<1$ and $X+Y \leq 1$.

Furthermore, the well support layer and the cap layer may be undoped. Alternatively, the well support layer and the cap layer may have a doping level of less than about $5\times10^{19}$ cm$^{-3}$.

In further embodiments of the present invention, the cap layer and the well support layer have a higher bandgap than the quantum well layer. The combined thickness of the well support layer and the cap layer may be from about 50 to about 400 Å. For example, the combined thickness of the well support layer and the cap layer may be greater than about 90 Å. Similarly, the combined thickness of the well support layer and the cap layer may be about 225 Å. The thickness of the well support layer may be greater than the thickness of the cap layer.

In additional embodiments of the present invention, the quantum well layer has a thickness of from about 10 to about 50 Å. For example, the quantum well layer may have a thickness of about 25 Å. Furthermore, the percentage of indium in the quantum well layer may from about 5% to about 50%.

In further embodiments of the Group III nitride based semiconductor device according to the present invention, a superlattice is provided and the well support layer is on the superlattice. The superlattice may have a bandgap of about 3.15 eV. Furthermore, a Group III nitride based spacer layer may be provided between the well support layer and the superlattice. The spacer layer may be undoped GaN. Also, the bandgap of the at least one quantum well may be less than the bandgap of the superlattice.

In still further embodiments of the present invention, a second well support layer comprising a Group III nitride is provided on the cap layer. A second quantum well layer comprising a Group III nitride is provided on the second well support layer; and a second cap layer comprising a Group III nitride is provided on the second quantum well layer.

In particular embodiments of the present invention, the Group III nitride based semiconductor device includes from about 2 to about 10 repetitions of the at least one quantum well structures.

Embodiments of the present invention further provide a Group III nitride based semiconductor device that includes a gallium nitride based superlattice having at least two periods of alternating layers of $In_XGa_{1-X}N$ and $In_YGa_{1-Y}N$, where $0 \leq X<1$ and $0 \leq Y<1$ and X is not equal to Y.

In further embodiments of the present invention, the gallium nitride based superlattice includes from about 5 to about 50 periods. For example, the gallium nitride based superlattice may include 25 periods. Similarly, the gallium nitride based superlattice may include 10 periods.

In additional embodiments of the present invention, the gallium nitride based superlattice comprises from about 5 to about 50 periods. The alternating layers of $In_XGa_{1-X}N$ and $In_YGa_{1-Y}N$ may have a combined thickness of from about 10 to about 140 Å.

In particular embodiments of the present invention, $X=0$ for layers of $In_XGa_{1-X}N$ of the superlattice. In such embodiments, the InGaN layers may have a thickness of from about 5 to about 40 Å and the GaN layers may have a thickness of from about 5 to about 100 Å. In still further embodiments of the present invention, the gallium nitride based superlattice is doped with an n-type impurity to a level of from about $1\times10^{17}$ cm$^{-3}$ to about $5\times10^{19}$ cm$^{-3}$. The doping level of the gallium nitride based superlattice may be an actual doping level of layers of the alternating layers or may be an average doping level of layers of the alternating layers.

In certain embodiments of the present invention, doped Group III nitride layers are provided adjacent the superlattice. The doped Group III nitride layers are doped with an n-type impurity to provide an average doping of the doped Group III nitride layers and the superlattice of from about $1\times10^{17}$ cm$^{-3}$ to about $5\times10^{19}$ cm$^{-3}$.

In additional embodiments of the present invention, a bandgap of the superlattice is about 3.15 eV.

In embodiments of the present invention where the Group III nitride based semiconductor device comprises a light emitting diode, the light emitting diode includes a Group III nitride based active region on the superlattice. Additionally, a Group III nitride based spacer layer may also be provided between the active region and the superlattice. Such a spacer layer may be undoped GaN.

In certain embodiments of the present invention, the active region comprises at least one quantum well. In such embodiments, a bandgap of the quantum well may be less than a bandgap of the superlattice.

Additional embodiments of the present invention provide a method of fabricating a Group III nitride based semiconductor device having an active region comprising at least one quantum well structure. The quantum well structure is fabricated by forming a well support layer comprising a Group III nitride, forming a quantum well layer comprising a Group III nitride on the quantum well support layer and forming a cap layer comprising a Group III nitride on the quantum well layer.

In particular embodiments of the present invention, forming a well support layer comprising a Group III nitride is provided by forming the well support layer at a first temperature. Forming a quantum well layer is provided by forming the quantum well layer at a second temperature which is less than the first temperature. Forming a cap layer is provided by forming the cap layer at a third temperature which is less than the first temperature. In certain embodiments of the present invention, the third temperature is substantially the same as the second temperature.

In further embodiments of the present invention, the well support layer comprises a gallium nitride based layer, the quantum well layer comprises an indium gallium nitride layer and the cap layer comprises a gallium nitride based layer. In such embodiments, the first temperature may be from about 700 to about 900° C. Furthermore, the second temperature may be from about 0 to about 200° C. less than the first temperature. The indium gallium nitride layer may be formed in a nitrogen atmosphere or other atmosphere.

Preferably, forming a well support layer and forming a cap layer are provided by forming a cap layer of $In_XGa_{1-X}N$, where $0 \leq X < 1$ and forming a well support layer of $In_XGa_{1-X}N$, where $0 \leq X < 1$. Also, the indium composition of the well support layer and the cap layer may be less an indium composition of the quantum well layer.

In additional embodiments of the present invention, forming a well support layer and forming a cap layer are provided by forming a cap layer of $Al_XIn_YGa_{1-X-Y}N$, where $0 < X < 1$, $0 \leq Y < 1$ and $X+Y \leq 1$ and forming a well support layer of $Al_XIn_YGa_{1-X-Y}N$, where $0 < X < 1$, $0 \leq Y < 1$ and $X+Y \leq 1$.

Further embodiments of the present invention include forming a superlattice, where the well support layer is on the superlattice. Additional embodiments of the present invention include, forming a Group III nitride based spacer layer between the well support layer and the superlattice. The spacer layer may be undoped GaN. Additional embodiments of the present invention include forming a second well support layer comprising a Group III nitride on the cap layer, forming a second quantum well layer comprising a Group III nitride on the second well support layer and forming a second cap layer comprising a Group III nitride on the second quantum well layer. In such embodiments, the second well support layer may be formed at substantially the first temperature, the second quantum well layer may be formed at substantially the second temperature which is less than the first temperature and the second cap layer formed at substantially the third temperature which is less than the first temperature.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
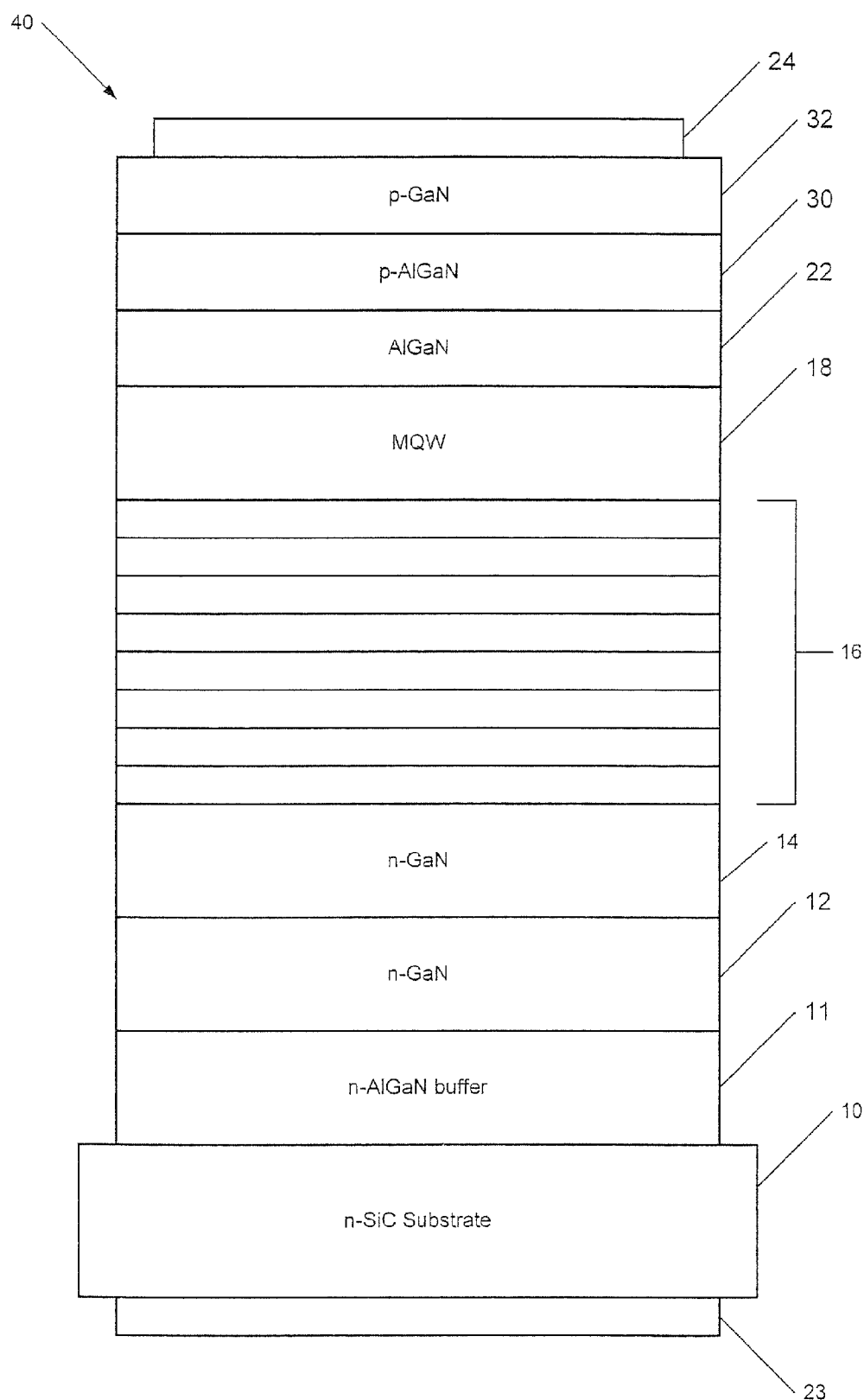
FIG. 1 is a schematic illustration of a Group III nitride light emitting diode incorporating embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will filly convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Moreover, each embodiment described and illustrated herein includes its complementary conductivity type embodiment as well.

Embodiments of the present invention will be described with reference to FIG. 1 that illustrates a light emitting diode (LED) structure 40. The LED structure 40 of FIG. 1 includes a substrate 10, which is preferably 4H or 6H n-type silicon carbide. Substrate 10 may also comprise sapphire, bulk gallium nitride-or another suitable substrate. Also included in the LED structure 40 of FIG. 1 is a layered semiconductor structure comprising gallium nitride-based semiconductor layers on substrate 10. Namely, the LED structure 40 illustrated includes the following layers: a conductive buffer layer 11, a first silicon-doped GaN layer 12, a second silicon doped GaN layer 14, a superlattice structure 16 comprising alternating layers of silicon-doped GaN and/or InGaN, an active region 18, which may be provided by a multi-quantum well structure, an undoped GaN and/or AlGaN layer 22, an AlGaN layer 30 doped with a p-type impurity, and a GaN contact layer 32, also doped with a p-type impurity. The structure further includes an n-type ohmic contact 23 on the substrate 10 and a p-type ohmic contact 24 on the contact layer 32.

Buffer layer 11 is preferably n-type AlGaN. Examples of buffer layers between silicon carbide and group III-nitride materials are provided in U.S. Pat. Nos. 5,393,993 and 5,523,589, and U.S. application Ser. No. 09/154,363 entitled "Vertical Geometry InGaN Light Emitting Diode" assigned to the assignee of the present invention, the disclosures of which are incorporated by reference as if fully set forth herein. Similarly, embodiments of the present invention may also include structures such as those described in U.S. Pat. No. 6,201,262 entitled "Group III Nitride Photonic Devices on Silicon Carbide Substrates With Conductive Buffer Interlay Structure," the disclosure of which is incorporated herein by reference as if set forth fully herein.

GaN layer 12 is preferably between about 500 and 4000 nm thick inclusive and is most preferably about 1500 nm thick. GaN layer 12 may be doped with silicon at a level of about $5 \times 10^{17}$ to $5 \times 10^{18}$ cm$^{-3}$. GaN layer 14 is preferably between about 10 and 500 Å thick inclusive, and is most preferably about 80 Å thick. GaN layer 14 may be doped with silicon at a level of less than about $5 \times 10^{19}$ cm$^{-3}$.

As illustrated in FIG. 1, a superlattice structure 16 according to embodiments of the present invention includes alternating layers of $In_XGa_{1-X}N$ and $In_YGa_{1-Y}N$, wherein X is between 0 and 1 inclusive and X is not equal to Y. Preferably, X=0 and the thickness of each of the alternating layers of InGaN is about 5-40 Å thick inclusive, and the thickness of each of the alternating layers of GaN is about 5-100 Å thick inclusive. In certain embodiments, the GaN layers are about 30 Å thick and the InGaN layers are about 15 Å thick. The superlattice structure 16 may include from about 5 to about 50 periods (where one period equals one repetition each of the $In_XGa_{1-X}N$ and $In_YGa_{1-Y}N$ layers that comprise the superlattice). In one embodiment, the superlattice structure 16 comprises 25 periods. In another embodiment, the superlattice structure 16 comprises 10 periods. The number of periods, however, may be decreased by, for example, increasing the thickness of the respective layers. Thus, for example, doubling the thickness of the layers may be utilized with half the number of periods. Alternatively, the number and thickness of the periods may be independent of one another.

Preferably, the superlattice 16 is doped with an n-type impurity such as silicon at a level of from about $1 \times 10^{17}$ cm$^{-3}$ to about $5 \times 10^{19}$ cm$^{-3}$. Such a doping level may be actual doping or average doping of the layers of the superlattice 16. If such doping level is an average doping level, then it may be beneficial to provide doped layers adjacent the superlattice structure 16 that provide the desired average doping which the doping of the adjacent layers is averaged over the adjacent layers and the superlattice structure 16. By providing the superlattice 16 between substrate 10 and active region 18, a better surface may be provided on which to grow InGaN-based active region 18. While not wishing to be bound by any theory of operation, the inventors believe that strain effects in the superlattice structure 16 provide a growth surface that is conducive to the growth of a high-quality InGaN-containing active region. Further, the superlattice is known to influence the operating voltage of the device. Appropriate choice of superlattice thickness and composition parameters can reduce operating voltage and increase optical efficiency.

The superlattice structure 16 may be grown in an atmosphere of nitrogen or other gas, which enables growth of higher-quality InGaN layers in the structure. By growing a silicon-doped InGaN/GaN superlattice on a silicon-doped GaN layer in a nitrogen atmosphere, a structure having improved crystallinity and conductivity with optimized strain may be realized.

In certain embodiments of the present invention, the active region 18 may comprise a single or multi-quantum well structure as well as single or double heterojunction active regions. In particular embodiments of the present invention, the active region 18 comprises a multi-quantum well structure that includes multiple InGaN quantum well layers separated by barrier layers (not shown in FIG. 1).

Layer 22 is provided on active region 18 and is preferably undoped GaN or AlGaN between about 0 and 120 Å thick inclusive. As used herein, undoped refers to a not intentionally doped. Layer 22 is preferably about 35 Å thick. If layer 22 comprises AlGaN, the aluminum percentage in such layer is preferably about 10-30% and most preferably about 24%. The level of aluminum in layer 22 may also be graded in a stepwise or continuously decreasing fashion. Layer 22 may be grown at a higher temperature than the growth temperatures in quantum well region 25 in order to improve the crystal quality of layer 22. Additional layers of undoped GaN or AlGaN may be included in the vicinity of layer 22. For example, LED 1 may include an additional layer of undoped AlGaN about 6-9 Å thick between the active region 18 and the layer 22.

An AlGaN layer 30 doped with a p-type impurity such as magnesium is provided on layer 22. The AlGaN layer 30 may be between about 0 and 300 Å thick inclusive and is preferably about 130 Å thick. A contact layer 32 of p-type GaN is provided on the layer 30 and is preferably about 1800 Å thick. Ohmic contacts 24 and 25 are provided on the p-GaN contact layer 32 and the substrate 10, respectively.

Figure 2:
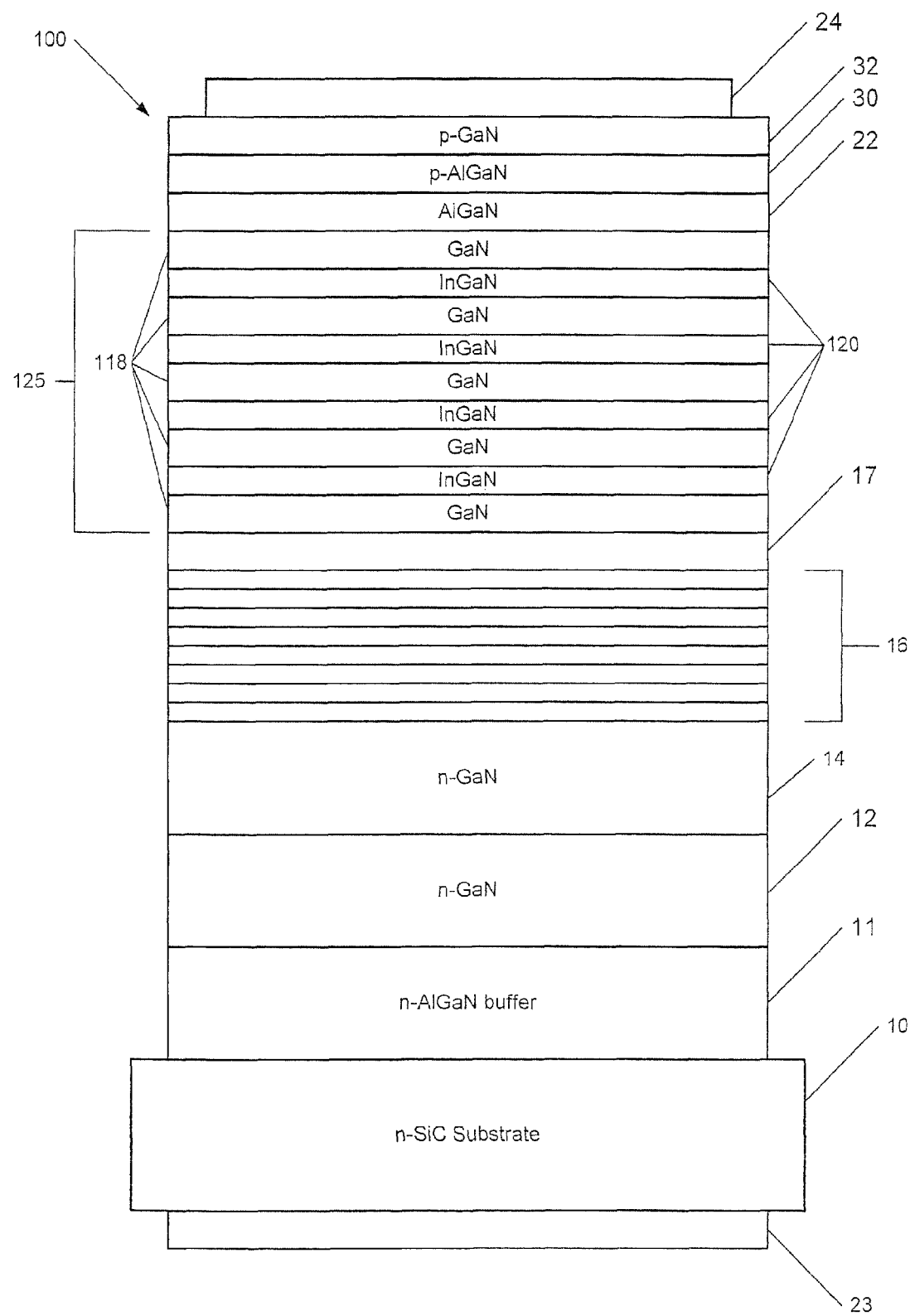
FIG. 2 is a schematic illustration of a Group III nitride light emitting diode incorporating further embodiments of the present invention.

FIG. 2 illustrates further embodiments of the present invention incorporating a multi-quantum well active region. The embodiments of the present invention illustrated in FIG. 2 include a layered semiconductor structure 100 comprising gallium nitride based semiconductor layers grown on a substrate 10. As described above, the substrate 10 may be SiC, sapphire or bulk gallium nitride. As is illustrated in FIG. 2, LEDs according to particular embodiments of the present invention may include a conductive buffer layer 11, a first silicon-doped GaN layer 12, a second silicon doped GaN layer 14, a superlattice structure 16 comprising alternating layers of silicon-doped GaN and/or InGaN, an active region 125 comprising a multi-quantum well structure, an undoped GaN or AlGaN layer 22, an AlGaN layer 30 doped with a p-type impurity, and a GaN contact layer 32, also doped with a p-type impurity. The LEDs may further include an n-type ohmic contact 23 on the substrate 10 and a p-type ohmic contact 24 on the contact layer 32. In embodiments of the present invention where the substrate 10 is sapphire, the n-type ohmic contact 23 would be provided on n-type GaN layer 12 and/or n-type GaN layer 14.

As described above with reference to FIG. 1, buffer layer 11 is preferably n-type AlGaN. Similarly, GaN layer 12 is preferably between about 5000 and 4000 nm thick inclusive and is most preferably about 1500 nm thick. GaN layer 12 may be doped with silicon at a level of about $5 \times 10^{17}$ to $5 \times 10^{18}$ cm$^{-3}$. GaN layer 14 is preferably between about 10 and 500 Å thick inclusive, and is most preferably about 80 Å thick. GaN layer 14 may be doped with silicon at a level of less than about $5 \times 10^{19}$ cm$^{-3}$. The superlattice structure 16 may also be provided as described above with reference to FIG. 1.

The active region 125 comprises a multi-quantum well structure that includes multiple InGaN quantum well layers 120 separated by barrier layers 118. The barrier layers 118 comprise $In_XGa_{1-X}N$ where $0 \leq X < 1$. Preferably the indium composition of the barrier layers 118 is less than that of the quantum well layers 120, so that the barrier layers 118 have a higher bandgap than quantum well layers 120. The barrier layers 118 and quantum well layers 120 may be undoped (i.e. not intentionally doped with an impurity atom such as silicon or magnesium). However, it may be desirable to dope the barrier layers 118 with Si at a level of less than $5 \times 10^{19}$ cm$^{-3}$, particularly if ultraviolet emission is desired.

In further embodiments of the present invention, the barrier layers 118 comprise $Al_XIn_YGa_{1-X-Y}N$ where $0 < X < 1$, $0 \leq Y < 1$ and X+Y≦1. By including aluminum in the crystal of the barrier layers 118, the barrier layers 118 may be lattice-matched to the quantum well layers 120, thereby providing improved crystalline quality in the quantum well layers 120, which increases the luminescent efficiency of the device.

Figure 3:
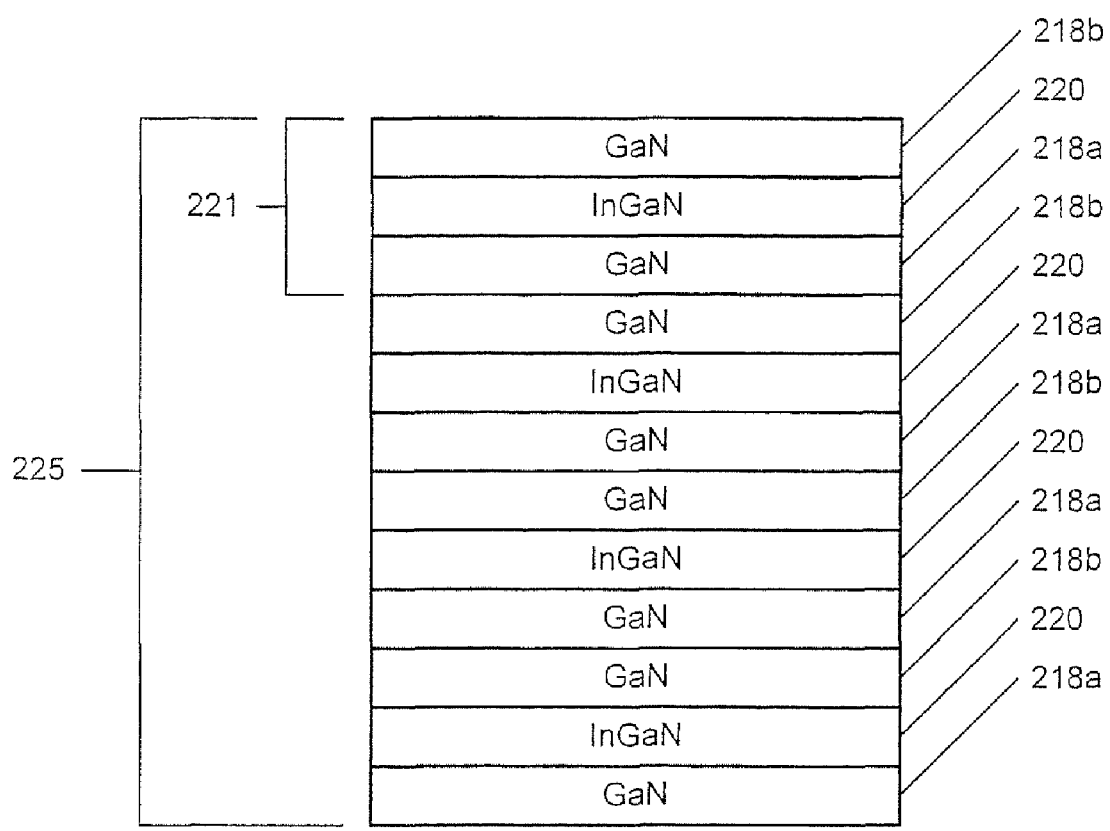
FIG. 3 is a schematic illustration of a quantum well structure and a multi-quantum well structure according to additional embodiments of the present invention.

Referring to FIG. 3, embodiments of the present invention that provide a multi-quantum well structure of a gallium nitride based device are illustrated. The multi-quantum well structure illustrated in FIG. 3 may provide the active region of the LEDs illustrated in FIG. 1 and/or FIG. 2. As seen in FIG. 3, an active region 225 comprises a periodically repeating structure 221 comprising a well support layer 218a having high crystal quality, a quantum well layer 220 and a cap layer 218b that serves as a protective cap layer for the quantum well layer 220. When the structure 221 is grown, the cap layer 218b and the well support layer 218a together form the barrier layer between adjacent quantum wells 220. Preferably, the high quality well support layer 218a is grown at a higher temperature than that used to grow the InGaN quantum well layer 220. In some embodiments of the present invention, the well support layer 218a is grown at a slower growth rate than the cap layer 218b. In other embodiments, lower growth rates may be used during the lower temperature growth process and higher growth rates utilized during the higher temperature growth process. For example, in order to achieve a high quality surface for growing the InGaN quantum well layer 220, the well support layer 218a may be grown at a growth temperature of between about 700 and 900° C. Then, the temperature of the growth chamber is lowered by from about 0 to about 200° C. to permit growth of the high-quality InGaN quantum well layer 220. Then, while the temperature is kept at the lower InGaN growth temperature, the cap layer 218b is grown. In that manner, a multi-quantum well region comprising high quality InGaN layers may be fabricated.

The active regions 125 and 225 of FIGS. 2 and 3 are preferably grown in a nitrogen atmosphere, which may provide increased InGaN crystal quality. The barrier layers 118, the well support layers 218a and/or the cap layers 218b may be between about 50-400 Å thick inclusive. The combined thickness of corresponding ones of the well support layers 218a and the cap layers 218b may be from about 50-400 Å thick inclusive. Preferably, the barrier layers 118 the well support layers 218a and/or the cap layers 218b are greater than about 90 Å thick and most preferably are about 225 Å thick. Also, it is preferred that the well support layers 218a be thicker than the cap layers 218b. Thus, the cap layers 218b are preferably as thin as possible while still reducing the desorption of Indium from or the degradation of the quantum well layers 220. The quantum well layers 120 and 220 maybe between about 10-50 Å thick inclusive. Preferably, the quantum well layers 120 and 220 are greater than 20 Å thick and most preferably are about 25 Å thick. The thickness and percentage of indium in the quantum well layers 120 and 220 may be varied to produce light having a desired wavelength. Typically, the percentage of indium in quantum well layers 120 and 220 is about 25-30%, however, depending on the desired wavelength, the percentage of indium has been varied from about 5% to about 50%.

In preferred embodiments of the present invention, the bandgap of the superlattice structure 16 exceeds the bandgap of the quantum well layers 120. This may be achieved by by adjusting the average percentage of indium in the superlattice 16. The thickness (or period) of the superlattice layers and the average Indium percentage of the layers should be chosen such that the bandgap of the superlattice structure 16 is greater than the bandgap of the quantum wells 120. By keeping the bandgap of the superlattice 16 higher than the bandgap of the quantum wells 120, unwanted absorption in the device may be minimized and luminescent emission may be maximized. The bandgap of the superlattice structure 16 may be from about 2.95 eV to about 3.35 eV. In a preferred embodiment, the bandgap of the superlattice structure 16 is about 3.15 eV.

In additional embodiments of the present invention, the LED structure illustrated in FIG. 2 includes a spacer layer 17 disposed between the superlattice 16 and the active region 125. The spacer layer 17 preferably comprises undoped GaN. The presence of the optional spacer layer 17 between the doped superlattice 16 and active region 125 may deter silicon impurities from becoming incorporated into the active region 125. This, in turn, may improve the material quality of the active region 125 that provides more consistent device performance and better uniformity. Similarly, a spacer layer may also be provided in the LED structure illustrated in FIG. 1 between the superlattice 16 and the active region 18.

Returning to FIG. 2, the layer 22 may be provided on the active region 125 and is preferably undoped GaN or AlGaN between about 0 and 120 Å thick inclusive. The layer 22 is preferably about 35 Å thick. If the layer 22 comprises AlGaN, the aluminum percentage in such layer is preferably about 10-30% and most preferably about 24%. The level of aluminum in the layer 22 may also be graded in a stepwise or continuously decreasing fashion. The layer 22 may be grown at a higher temperature than the growth temperatures in the active region 125 in order to improve the crystal quality of the layer 22. Additional layers of undoped GaN or AlGaN may be included in the vicinity of layer 22. For example, the LED illustrated in FIG. 2 may include an additional layer of undoped AlGaN about 6-9 Å thick between the active regions 125 and the layer 22.

An AlGaN layer 30 doped with a p-type impurity such as magnesium is provided on layer 22. The AlGaN layer 30 may be between about 0 and 300 Å thick inclusive and is preferably about 130 Å thick. A contact layer 32 of p-type GaN is provided on the layer 30 and is preferably about 1800 Å thick. Ohmic contacts 24 and 25 are provided on the p-GaN contact layer 32 and the substrate 10, respectively. Ohmic contacts 24 and 25 are provided on the p-GaN contact layer 32 and the substrate 10, respectively.

While embodiments of the present invention have been described with multiple quantum wells, the benefits from the teachings of the present invention may also be achieved in single quantum well structures. Thus, for example, a light emitting diode may be provided with a single occurrence of the structure 221 of FIG. 3 as the active region of the device. Thus, while different numbers of quantum wells may be utilized according to embodiments of the present invention, the number of quantum wells will typically range from 1 to 10 quantum wells.

While embodiments of the present invention have been described with reference to gallium nitride based devices, the teachings and benefits of the present invention may also be provided in other Group III nitrides. Thus, embodiments of the present invention provide Group III nitride based superlattice structures, quantum well structures and/or Group III nitride based light emitting diodes having superlattices and/or quantum wells.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating a Group III nitride based semiconductor device having an active region comprising at least one quantum well structure, the method comprising:
   forming a first well support layer comprising a Group III nitride;
   forming a first quantum well layer comprising a Group III nitride on the first well support layer;
   forming a first cap layer comprising a Group III nitride on the first quantum well layer;
   forming a second well support layer comprising a Group III nitride directly on the first cap layer, wherein the first cap layer and the second well support layer directly thereon define a barrier layer of the quantum well structure;
   forming a second quantum well layer comprising a Group III nitride on the second well support layer; and
   forming a second cap layer comprising a Group III nitride on the second quantum well layer;
   wherein the well support layers have a higher crystal quality than the cap layers.

2. The method of claim 1, wherein the first cap layer and first well support layer have a higher bandgap than the first quantum well layer.

3. The method of claim 1, wherein a combined thickness of the second well support layer and the first cap layer is from about 50 to about 400 Å.

4. The method of claim 1, wherein a combined thickness of the second well support layer and the first cap layer is less than about 400 Å, and wherein a thickness of the first quantum well layer is less than about 50 Å.

5. The method of claim 1, wherein a combined thickness of the second well support layer and the first cap layer is less than about 400 Å, and wherein a thickness of the first or second quantum well layer is less than about 50 Å.

6. The method of claim 1, wherein forming the second well support layer and forming the first cap layer comprise forming the second well support layer of $In_xGa_{1-x}N$, where $0 \leq X < 1$, directly on the first cap layer and forming the first cap layer of $In_xGa_{1-x}N$, where $0 \leq X < 1$.

7. The method of claim 1, wherein forming the second well support layer and forming the first cap layer comprise forming the second well support layer of $Al_xIn_yGa_{1-X-Y}N$, where $0 < X < 1$, $0 \leq Y < 1$ and $X+Y \leq 1$, directly on the first cap layer and forming the first cap layer of $Al_xIn_yGa_{1-X-Y}N$, where $0 < X < 1$, $0 \leq Y < 1$ and $X+Y \leq 1$.

8. The method of claim 1, further comprising:
   forming a third well support layer comprising a Group III nitride directly on the second cap layer, wherein the second cap layer and the third well support layer directly thereon define a second barrier layer of the quantum well structure;
   forming a third quantum well layer comprising a Group III nitride on the third well support layer; and
   forming a third cap layer comprising a Group III nitride on the third quantum well layer.

9. A method of fabricating a Group III nitride based semiconductor device having an active region comprising at least one quantum well structure, the method comprising:
   forming a first well support layer comprising a Group III nitride;
   forming a first quantum well layer comprising a Group III nitride on the first well support layer;
   forming a first cap layer comprising a Group III nitride on the first quantum well layer;
   forming a second well support layer comprising a Group III nitride directly on the first cap layer;
   forming a second quantum well layer comprising a Group III nitride on the second well support layer; and
   forming a second cap layer comprising a Group III nitride on the second quantum well layer,
   wherein the step of forming the first well support layer comprising a Group III nitride comprises forming the first well support layer at a first temperature,
   wherein the step of forming the first quantum well layer comprises forming the first quantum well layer at a second temperature which is less than the first temperature, and
   wherein the step of forming the first cap layer comprises forming the first cap layer at a third temperature which is less than the first temperature.

10. The method of claim 9, further comprising forming from about 2 to about 10 repetitions of the at least one quantum well structure.

11. The method of claim 9, wherein the step of forming the second well support layer comprising a Group III nitride comprises forming the second well support layer at substantially the first temperature;
   wherein the step of forming the second quantum well layer comprises forming the second quantum well layer at substantially the second temperature which is less than the first temperature; and
   wherein the step of forming the second cap layer comprises forming the second cap layer at substantially the third temperature which is less than the first temperature.

12. The method of claim 11, wherein the third temperature is substantially the same as the second temperature.

13. The method of claim 9, wherein the third temperature is substantially the same as the second temperature.

14. The method of claim 13, wherein the first well support layer comprises a gallium nitride based layer, the first quantum well layer comprises an indium gallium nitride layer and the first cap layer comprises a gallium nitride based layer.

15. The method of claim 14, wherein the first temperature is from about 700 to about 900° C.

16. The method of claim 14, wherein the second temperature is from about 0 to about 200° C. less than the first temperature.

17. The method of claim 14, wherein the second temperature is less that the first temperature.

18. The method of claim 14, wherein the indium gallium nitride layer is formed in a nitrogen atmosphere.

19. The method of claim 14, wherein the steps of forming the first well support layer and forming the first cap layer comprise forming the first cap layer of $In_xGa_{1-x}N$, where $0 \leq X < 1$ and forming a well support layer of $In_xGa_{1-x}N$, where $0 \leq X < 1$.

20. The method of claim 19, wherein an indium composition of the first well support layer and the first cap layer is less an indium composition of the first quantum well layer.

21. The method of claim 14, wherein the steps of forming the first well support layer and forming the first cap layer comprise forming the first cap layer of $Al_xIn_yGa_{1-X-Y}N$, where $0 < X < 1$, $0 \leq Y < 1$ and $X+Y \leq 1$ and forming a well support layer of $Al_xIn_yGa_{1-X-Y}N$, where $0 < X < 1$, $0 \leq Y < 1$ and $X+Y \leq 1$.

22. The method of claim 21, wherein $X < Y + 0.05$.

23. The method of claim 14, wherein the first well support layer and the first cap layer are undoped.

24. The method of claim 14, wherein the first well support layer and the first cap layer have a doping level of less than about $5 \times 10^{19}$ cm$^{-3}$.

25. The method of claim 14, wherein a thickness of the first well support layer is greater than a thickness of the first cap layer.

26. The method of claim 14, wherein the first quantum well layer has a thickness of from about 10 to about 50 Å.

27. The method of claim 14, wherein a percentage of indium in the first quantum well layer is from about 5% to about 50%.

28. The method of claim 14, further comprising the step of forming a superlattice, wherein the first well support layer is on the superlattice.

29. The method of claim 28, further comprising the step of forming a Group III nitride based spacer layer between the first well support layer and the superlattice.

30. The method of claim 29, wherein the spacer layer comprises undoped GaN.

31. The method of claim 28, wherein a bandgap of the first quantum well layer is less than a bandgap of the superlattice.

* * * * *

UNITED STATES PATENT AND TRADEMARK OFFICE
CERTIFICATE OF CORRECTION

PATENT NO. : 8,227,268 B2  Page 1 of 1
APPLICATION NO. : 11/875353
DATED : July 24, 2012
INVENTOR(S) : Emerson et al.

It is certified that error appears in the above-identified patent and that said Letters Patent is hereby corrected as shown below:

In the Claims:

Column 12, Claim 17, Line 45: Please correct "less that the"
to read -- less than the --

Column 12, Claim 21, Line 59: Please correct "forming a well"
to read -- forming the first well --

Signed and Sealed this
Eighteenth Day of December, 2012

David J. Kappos
*Director of the United States Patent and Trademark Office*